United States Patent [19]

Ando et al.

[11] Patent Number: 4,791,241
[45] Date of Patent: Dec. 13, 1988

[54] STABILIZED SUPERCONDUCTING WIRE

[75] Inventors: Toshinari Ando; Masataka Nishi; Yoshikazu Takahashi; Susumu Shimamoto, all of Ibaraki, Japan

[73] Assignees: Japan Atomic Energy Research Institute; Sumitomo Elec. Inc. Ltd., both of Osaka, Japan

[21] Appl. No.: 51,400

[22] Filed: May 19, 1987

[30] Foreign Application Priority Data

May 19, 1986 [JP] Japan .................. 61-114457

[51] Int. Cl.$^4$ ............................. H01B 12/00
[52] U.S. Cl. .................. 174/125.1; 29/599; 428/930; 505/887
[58] Field of Search .............. 174/126 S, 128 S; 29/599; 428/930

[56] References Cited

U.S. PATENT DOCUMENTS

| | | | |
|---|---|---|---|
| 3,958,327 | 5/1976 | Marancik et al. | 29/599 |
| 4,094,060 | 6/1978 | Madsen et al. | 29/599 |
| 4,205,119 | 5/1980 | Young et al. | 29/599 X |
| 4,330,347 | 5/1982 | Hirayama et al. | 428/930 X |
| 4,391,657 | 7/1983 | Feldmann et al. | 29/599 X |
| 4,652,697 | 5/1987 | Ando et al. | 29/599 X |

FOREIGN PATENT DOCUMENTS 178676 9/1985 Japan ..................... 29/599

Primary Examiner—Morris H. Nimmo
Attorney, Agent, or Firm—Staas & Halsey

[57] ABSTRACT

A stabilized superconducting wire comprises a multi-core section having a number of filaments of superconducting compound material disposed in an alloy matrix, a stabilizing material section positioned around the multicore section, and a diffusion barrier layer disposed between the stabilizing material section and the multicore section and formed of an Fe-Cr alloy containing not less than 5 weight percent but not more than 25 weight percent Cr.

4 Claims, 1 Drawing Sheet

STABILIZED SUPERCONDUCTING WIRE

BACKGROUND OF THE INVENTION

1. Field of the Invention

This invention relates to a stabilized superconducting wire having a stabilizing material section disposed around a multicore section and particularly to a stabilized superconducting wire having a barrier layer (hereinafter referred to as diffusion barrier layer) which is improved to prevent elements in an alloy matrix from diffusing into a stabilizing material section to contaminate the latter.

2. Description of the Related Art

In the application of superconduction to nuclear fusion, energy storage, analytic NMR magnets, etc., there is a need for a superconducting wire which will exhibit superior characteristics in high magnetic fields. For practical superconducting wires for use in high magnetic fields, such superconducting compound materials as $Nb_3Sn$ and $V_3Ga$ are used. These superconducting compound materials are produced by the so-called "bronze process." In the case of $Nb_3Sn$, an Nb multicore section in a Cu-Sn alloy matrix is subjected to a heat treatment which brings about a diffusion reaction between the Nb and the Sn in the matrix, thereby forming $Nb_3Sn$. In the case of $V_3Ga$, a V multicore section in a Cu-Ga alloy matrix is subjected to a heat treatment which brings about a diffusion reaction between the V and the Ga in the matrix, thereby forming $V_3Ga$.

FIG. 1 is a perspective view for explaining a conventional stabilized superconducting wire using a superconducting compound material. In FIG. 1, a stabilizing material section 4 is positioned around a multicore section 1 composed of a number of filaments 11 of superconducting compound material placed in an alloy matrix. Disposed between said stabilized material section 4 and the multicore section 1 is a diffusion barrier layer 6. Cu is generally used for the stabilizing material section 4. A desirable material for the diffusion barrier layer is one which has satisfactory plastic workability not to produce such drawbacks as breakage during wire drawing process and which hardly diffuses into the stabilizing material section. Heretofore, such metals as Nb and Ta have been used as materials which meet these requirements.

However, since Nb and Ta are expensive, the use of these metals as a diffusion barrier layer brings about a corresponding problem in that the cost of the resulting superconducting wire is high. Thus, there has been a need for an inexpensive material for diffusion barrier layers.

In the case where Nb is used as a diffusion barrier layer and $Nb_3Sn$ as a superconducting compound material, there has been the problem of a large coupling loss occurring in the multicore. This is caused by the Sn in the alloy matrix diffusing to the Nb in the diffusion barrier layer to react with the Nb during heat treatment, thereby forming a cylindrical $Nb_3Sn$ superconducting layer in the interface between the alloy matrix and the diffusion barrier layer. When subjected to a varying magnetic field, this $Nb_3Sn$ superconducting layer produces a large hysteresis loss and also produces a large coupling loss in the multicore; as a result, it drastically decreases the efficiency of the superconducting wire.

SUMMARY OF THE INVENTION

Accordingly, an object of the invention is to provide a stabilized superconducting wire provided with a diffusion barrier layer which effectively prevents elements in an alloy matrix from diffusing into a stabilized material section and which does not produce large hysteresis losses even when placed in a varying magnetic field.

A stabilized superconducting wire according to the invention is characterized by comprising a multicore section having a number of filaments of superconducting compound material disposed in an alloy matrix, a stabilizing material section positioned around said multicore section, and a diffusion barrier layer disposed between said stabilizing material section and said multicore section, said diffusion barrier layer being composed of an Fe-Cr alloy containing not less than 5 weight percent but not more than 25 weight percent Cr.

The Fe-Cr alloy used as a diffusion barrier layer in this invention has satisfactory plastic workability, precluding the possibility of producing such drawbacks as breakage during the wire drawing process. Further, the Fe-Cr alloy is a material which hardly diffuses into a stabilizing material section which consists, for example, of Cu.

The reason why the concentration in the Fe-Cr alloy should be not less than 5 weight percent but not more than 25 weight percent is that within this range the plastic workability is superior. That is, the plastic workability lowers on the one hand due to an increase in the martensitic layer and the coarsening of ferrite crystals if the Cr concentration is less than 5 weight percent and on the other hand due to occurrence of $\gamma$ phase if it is more than 25 weight percent.

These objects and other objects, features, aspects and advantages of this invention will become more apparent from the following detailed description of the present invention when taken in conjunction with the accompanying drawings.

DESCRIPTION OF THE PREFERRED EMBODIMENTS

Figure 1:
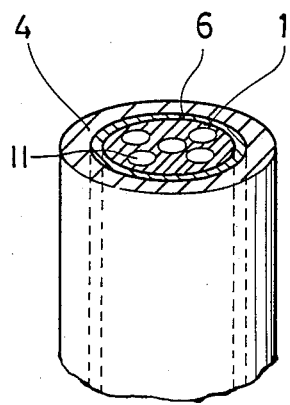
FIG. 1 is a perspective view for explaining a conventional stabilized superconducting wire.
Figure 2:
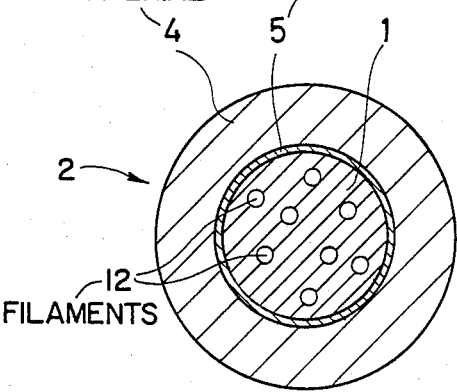
FIG. 2 is a top cross-sectional view illustrating an embodiment of the invention.

FIG. 2 is a top cross-sectional view showing an embodiment of the invention. In FIG. 2, in a stabilized superconducting wire 2 an Fe-Cr alloy layer 5 serving as a diffusion barrier layer is provided around a multicore section 1. $Nb_3Sn$ or $V_3Ga$ is used as the superconducting compound material for the filaments 12 of the multicore section 1, and in this case a Cu-Sn alloy or Cu-Ga alloy is used as the alloy matrix for the multicore section 1. Cu is generally used as the material of the stabilizing material section 4.

Figure 3:
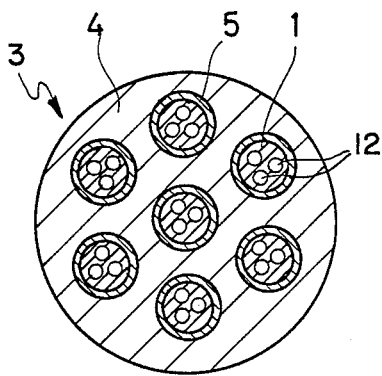
FIG. 3 is a top cross-sectional view illustrating another embodiment of the invention.

FIG. 3 is a top cross-sectional view showing another embodiment of the invention. In FIG. 3, a stabilized superconducting wire 3 has a plurality of multicore sections 1. In FIG. 3 also, as in FIG. 2, an Fe-Cr alloy layer 5 serving as a diffusion barrier layer 5 is provided between each multicore section 1 and the stabilizing material section 4.

The stabilized superconducting wires 2 and 3 of this invention is produced by a manufacturing method based on extrusion of a composite billet. This manufacturing method will now be described.

Figure 4:
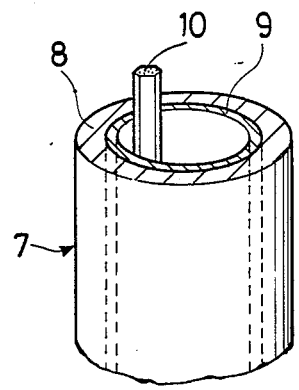
FIG. 4 is a perspective view illustrating a method of forming a stabilized superconducting wire.

FIG. 4 is an exploded perspective view of a composite billet which is used to form the stabilized superconducting wire 2 of FIG. 2, wherein Nb$_3$Sn is used as the superconducting compound material and Cu as the stabilizing material. In manufacturing the stabilized superconducting wire 2, an Fe-13 weight percent Cr alloy pipe 9 is inserted in a Cu pipe 8, which will serve as the stabilizing material section 4 in the finished product, 151 hexagonal bars 10 serving as multicore wires (with 55 Nb cores) using a Cu-13 weight percent Sn alloy as the matrix will form the multicore section 1. The bars 10 are densely packed in the alloy pipe 9, (which will be the diffusion barrier layer in the finished product) thereby assembling the composite billet 7. In FIG. 4, only one hexagonal bar 10 is shown. Next the billet 7 is evacuated in a vacuum chamber, (not shown) and lids (not shown) are welded thereto at the top and bottom by electron beams.

Subsequently, the composite billet 7 is extruded into a diameter of 30 mm, and then, while repeating intermediate softening, the resulting product (not shown) drawn into a wire with a diameter of 1.2 mm. In this wire, the thickness of the diffusion barrier layer which consists of the Fe-13 weight percent Cr alloy pipe 9, is about 10 μm.

To form an Nb$_3$Sn superconducting compound material layer (the multicore section 1), the wire is subjected to a heat treatment for 100 hours at about 700° C., resulting in the finished stabilized superconducting wire 2.

An examination of the now finished cross section of the wire 2 using a metal microscope and composition analysis using an X-ray microanalyzer ascertained that the reaction between Sn and Nb had changed the Nb multicore hexagonal bars 10 in the Cu-13 weight percent Sn matrix into a superconducting compound material, Nb$_3$Sn (multicore section 1). It was also ascertained that almost no Sn was present in the stabilizing material section 4, indicating that diffusion of Sn was prevented by the diffusion barrier layer 5. It was ascertained that Fe-Cr alloy itself did not diffuse into the stabilizing material section 4. Further, the diffusion barrier layer 5 was uniformly plastically deformed, there being found no such drawbacks as local breakage.

The above embodiments refer to the case where Nb$_3$Sn was formed as the superconducting compound material, but the same result was attained when V$_3$Ga was formed as the superconducting compound material. That is, in this case also, the Ga in the Cu-Ga alloy matrix did not diffuse into the stabilized material section. Further, the same result was also obtained when Nb$_3$Al was formed as the superconducting compound material.

Although this invention has been described and illustrated in detail, it is clearly understood that the same is by way of illustration and example only and is not to be taken by way of limitation, the spirit and scope of this invention being limited only by the terms of the appended claims.

What is claimed is:

1. A stabilized superconducting wire comprising a multicore section having a plurality of filaments of superconducting compound material disposed in an alloy matrix, a stabilizing material section positioned around said multicore section, and a diffusion barrier layer disposed between said stabilizing material section and said multicore section, said stabilized superconducting wire being characterized in that:

said diffusion barrier layer is composed of an Fe-Cr alloy containing not less than 5 weight percent but not more than 25 weight percent Cr.

2. A stabilized superconducting wire as set forth in claim 1, wherein said superconducting compound material is Nb$_3$Sn.

3. A stabilized superconducting wire as set forth in claim 1, wherein said superconducting compound material is V$_3$Ga.

4. A stabilized superconducting wire as set forth in claim 1, wherein said superconducting compound material is Nb$_3$Al.

* * * * *

UNITED STATES PATENT AND TRADEMARK OFFICE
CERTIFICATE OF CORRECTION

PATENT NO. : 4,791,241

DATED : December 13, 1988

INVENTOR(S) : Toshinari Ando

It is certified that error appears in the above-identified patent and that said Letters Patent is hereby corrected as shown below:

On the Title Page,
    [75] line 3, after "Ibaraki," insert --Hiromi Takei, Osaka, all of Japan--.

[73] line 2, "Inc." should be --Ind.--.

Col. 1, line 51, after "problem" insert --,--.

Col. 3, line 15, "uct," should be --uct.--;
          line 18, delete ",";
          line 20, after "product)" insert --,--;
          line 21, after "Next" insert --,--;
          line 29, after "layer" insert --,--.

Signed and Sealed this

Second Day of May, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,791,241
DATED : DECEMBER 13, 1988
INVENTOR(S) : TOSHINARI ANDO ET AL.

It is certified that error appears in the above-identified patent and that said Letters Patent is hereby corrected as shown below:

FRONT PAGE [73], please delete this section in its entirety, and in place thereof, insert the following new section:

--[73] Assignees: Japan Atomic Energy Research Institute, Tokyo; Sumitomo Elec. Inc. Ltd., Osaka, both of Japan--.

Signed and Sealed this

Second Day of January, 1990

Attest:

JEFFREY M. SAMUELS

Attesting Officer    Acting Commissioner of Patents and Trademarks

UNITED STATES PATENT AND TRADEMARK OFFICE
CERTIFICATE OF CORRECTION

PATENT NO. : 4,791,241
DATED : DECEMBER 13, 1988
INVENTOR(S) : TOSHINARI ANDO ET AL.

It is certified that error appears in the above-identified patent and that said Letters Patent is hereby corrected as shown below:

FRONT PAGE [73] please delete this section in its entirety, and in place thereof, insert the following ne section:

--[73] Assignees: Japan Atomic Energy Research Institute, Tokyo; Sumitomo Elec. Ind. Ltd., Osaka, both of Japan--.

This certificate supersedes Certificate of Correction issued January 2, 1990.

Signed and Sealed this

Twenty-seventh Day of November, 1990

*Attest:*

HARRY F. MANBECK, JR.

*Attesting Officer*  *Commissioner of Patents and Trademarks*